(12) United States Patent
Kalutarage et al.

(10) Patent No.: US 12,618,153 B2
(45) Date of Patent: May 5, 2026

(54) MULTIPLE-METAL-CONTAINING METAL-OXO PHOTORESIST FILMS BY CVD AND ALD METHODS

(71) Applicant: Applied Materials, Inc., Santa Clara, CA (US)

(72) Inventors: Lakmal Kalutarage, San Jose, CA (US); Madhur Sachan, Belmont, CA (US); Mark Saly, Milpitas, CA (US); Zhenxing Han, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 67 days.

(21) Appl. No.: 18/403,628

(22) Filed: Jan. 3, 2024

(65) Prior Publication Data

US 2024/0271276 A1 Aug. 15, 2024

Related U.S. Application Data

(60) Provisional application No. 63/444,868, filed on Feb. 10, 2023.

(51) Int. Cl.
  *C23C 16/06* (2006.01)
  *C23C 16/455* (2006.01)
(52) U.S. Cl.
  CPC ........ *C23C 16/45525* (2013.01); *C23C 16/06* (2013.01)
(58) Field of Classification Search
  CPC ........................... C23C 16/45525; C23C 16/06
  See application file for complete search history.

(56) References Cited

U.S. PATENT DOCUMENTS

| | | | |
|---|---|---|---|
| 9,328,415 B2* | 5/2016 | Thompson | C23C 16/18 |
| 2015/0118100 A1* | 4/2015 | Anthis | C23C 16/45553 |
| | | | 427/255.394 |
| 2020/0002814 A1* | 1/2020 | Knisley | C01B 21/0635 |
| 2020/0240017 A1* | 7/2020 | Knisley | C23C 16/38 |
| 2022/0002869 A1* | 1/2022 | Kalutarage | G03F 7/0043 |
| 2022/0004105 A1* | 1/2022 | Dai | G03F 7/162 |
| 2022/0026807 A1* | 1/2022 | Kalutarage | G03F 7/168 |
| 2022/0155689 A1* | 5/2022 | Houshmand | H01L 21/68735 |

OTHER PUBLICATIONS

Del Re, Ryan, "Molecular organometallic resists of tin and tellurium" (2015). Legacy Theses & Dissertations (2009-2024). 1370, 3 pages. Abstract Only.*

(Continued)

*Primary Examiner* — Bret P Chen

(74) *Attorney, Agent, or Firm* — Schwabe, Williamson & Wyatt, P.C.

(57) ABSTRACT

Embodiments disclosed herein include a method of forming a metal-oxo photoresist. In an embodiment, the method comprises flowing a first precursor into a chamber, where the first precursor comprises a first metal. In an embodiment, the method further comprises flowing a second precursor into the chamber, where the second precursor comprises a second metal that is different than the first metal. In an embodiment, the method further comprises depositing the metal-oxo photoresist on a substrate in the chamber using a dry deposition process using the first precursor and the second precursor.

16 Claims, 7 Drawing Sheets

(56)    References Cited

OTHER PUBLICATIONS

Yeh, Chun-Cheng, et al., "Chemical and structural investigation of zinc-oxo cluster photoresists for DUV lithography". J. Mater. Chem. C, 2017, 5, 2611-2619.*

Si, Youming, et al., "A novel stable zinc-oxo cluster for advanced lithography patterning". J. Mater. Chem. A, 2023, 11, 4801-4807.*

Milanov, Andrian P., et al., "Homoleptic Gadolinium Guanidinate: A Single Source Precursor for Metal-Organic Chemical Vapor Deposition of Gadolinium Nitride Thin Films". J. Am. Chem. Soc. 2009, 131, 17062-17063.*

Musetha, P. L., et al., "Homoleptic single molecular precursors for the deposition of platinum and palladium chalcogenide thin films". Thin Solid Films, vol. 519, Issue 1, Oct. 29, 2010, pp. 197-202.*

* cited by examiner

410

410

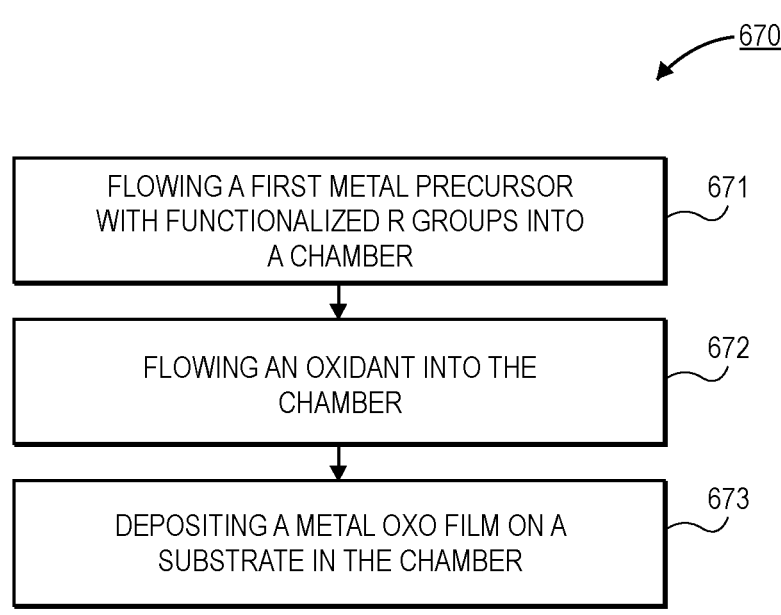
*670*
| 671 |
| --- |
| FLOWING A FIRST METAL PRECURSOR WITH FUNCTIONALIZED R GROUPS INTO A CHAMBER |
| 672 |
| --- |
| FLOWING AN OXIDANT INTO THE CHAMBER |
| 673 |
| --- |
| DEPOSITING A METAL OXO FILM ON A SUBSTRATE IN THE CHAMBER |
FIG. 6
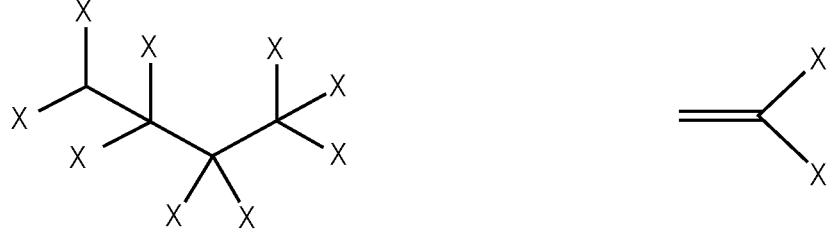
FIG. 7A          FIG. 7B

FIG. 7C  FIG. 7D
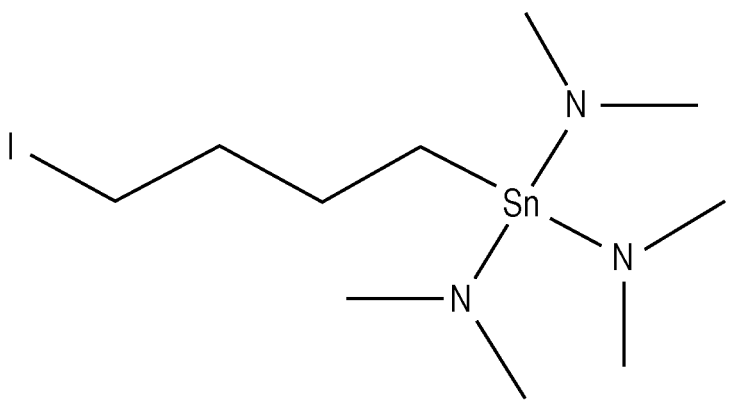
FIG. 8

MULTIPLE-METAL-CONTAINING METAL-OXO PHOTORESIST FILMS BY CVD AND ALD METHODS

CROSS-REFERENCE TO RELATED APPLICATIONS

This application claims the benefit of U.S. Provisional Application No. 63/444,868, filed on Feb. 10, 2023, the entire contents of which are hereby incorporated by reference herein.

BACKGROUND

1) Field

Embodiments of the present disclosure pertain to the field of semiconductor processing and, in particular, to chemical vapor deposition (CVD) or atomic layer deposition (ALD) processes for forming multiple-metal-containing metal-oxo photoresist films.

2) Description of Related Art

Lithography has been used in the semiconductor industry for decades for creating 2D and 3D patterns in microelectronic devices. The lithography process involves spin-on deposition of a film (photoresist), irradiation of the film with a selected pattern by an energy source (exposure), and removal (etch) of exposed (positive tone) or non-exposed (negative tone) region of the film by dissolving in a solvent. A bake will be carried out to drive off remaining solvent.

The photoresist should be a radiation sensitive material and upon irradiation a chemical transformation occurs in the exposed part of the film which enables a change in solubility between exposed and non-exposed regions. Using this solubility change, either exposed or non-exposed regions of the photoresist is removed (etched). Now the photoresist is developed and the pattern can be transferred to the underlying thin film or substrate by etching. After the pattern is transferred, the residual photoresist is removed and repeating this process many times can give 2D and 3D structures to be used in microelectronic devices.

Several properties are important in lithography processes. Such important properties include sensitivity, resolution, lower line-edge roughness (LER), etch resistance, and ability to form thinner layers. When the sensitivity is higher, the energy required to change the solubility of the as-deposited film is lower. This enables higher efficiency in the lithographic process. Resolution and LER determine how narrow features can be achieved by the lithographic process. Higher etch resistant materials are required for pattern transferring to form deep structures. Higher etch resistant materials also enable thinner films. Thinner films increase the efficiency of the lithographic process.

SUMMARY

Embodiments disclosed herein include a method of forming a metal-oxo photoresist. In an embodiment, the method comprises flowing a first precursor into a chamber, where the first precursor comprises a first metal. In an embodiment, the method further comprises flowing a second precursor into the chamber, where the second precursor comprises a second metal that is different than the first metal. In an embodiment, the method further comprises depositing the metal-oxo photoresist on a substrate in the chamber using a dry deposition process using the first precursor and the second precursor.

Embodiments disclosed herein further include a method of forming a metal-oxo photoresist, comprising flowing a precursor gas into a chamber, where the precursor gas comprises a general formula of $MR_xL_{n-x}$. In an embodiment, M is a metal, R is a reactive group, and L is a ligand, and x is equal to 1-4 and n is equal to 1-5. The method may further comprise flowing an oxidant into the chamber, and depositing the metal-oxo photoresist onto a substrate in the chamber with a dry deposition process.

Embodiments disclosed herein may further comprise a metal-oxo photoresist. In an embodiment, the metal-oxo photoresist comprises a first metal element, and a second metal element, where the second metal element is chemically bonded to the first metal element. In an embodiment, the metal-oxo photoresist further comprises carbon bonded to one or both of the first metal element and the second metal element, and oxygen bonded to the first metal element, the second metal element, and/or the carbon.

BRIEF DESCRIPTION OF THE DRAWINGS

FIG. 6 is a process flow diagram of a process for forming a metal-oxo photoresist with a metal precursor with functionalized reactive groups, in accordance with an embodiment.

FIGS. 7A-7D are examples, of functionalized reactive groups, in accordance with various embodiments.

FIG. 8 is an example of a metal precursor with reactive groups that are functionalized, in accordance with an embodiment.

DETAILED DESCRIPTION

Figure 1:
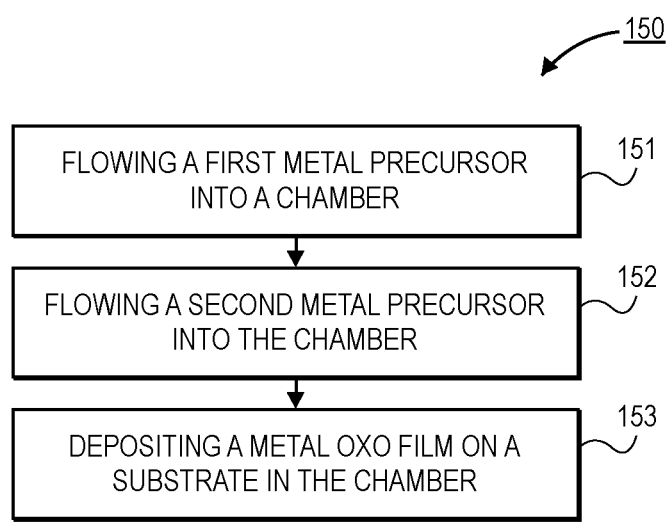
FIG. 1 is a process flow diagram of a process for depositing a metal-oxo photoresist onto a substrate with a dry deposition process that includes two different metal precursors, in accordance with an embodiment.

Chemical vapor deposition (CVD) or atomic layer deposition (ALD) processes for forming multiple-metal-containing metal-oxo photoresist films are described herein. In the following description, numerous specific details are set forth, such as thermal vapor phase processes and material regimes for developing photoresist, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

To provide context, photoresist systems used in extreme ultraviolet (EUV) lithography suffer from low efficiency. That is, existing photoresist material systems for EUV lithography require high dosages in order to provide the needed solubility switch that allows for developing the photoresist material. Organic-inorganic hybrid materials (e.g., metal-oxo materials systems) have been proposed as a material system for EUV lithography due to the increased sensitivity to EUV radiation. Such material systems typically comprise a metal (e.g., Sn, Hf, Zr, etc.), oxygen, and carbon. Metal-oxo based organic-inorganic hybrid materials have also been shown to provide lower LER, LWR, and higher resolution, which are required characteristics for forming narrow features.

In a metal-oxo photoresist system, exposure to EUV radiation results in crosslinking and the removal of carbon. The difference in the carbon percentage between the exposed regions and the unexposed regions is used as the solubility switch during developing. Particularly, the unexposed regions with the higher carbon content are preferentially etched by the developer solution in a negative tone develop. Though, it is to be appreciated that a positive tone develop may also be used in some embodiments.

In many instances, the metal-oxo photoresist is applied with a wet process. Wet processes may use a spin-on operation in order to deposit and spread the metal-oxo material. That is, a volume of liquid metal-oxo material is dispensed on the surface of the substrate, and the substrate is spun at high revolutions per minute (RPM) in order to spread the liquid evenly over the surface of the substrate. As can be appreciated, spin-on processes result in a high volume of waste. This waste can result in increases in cost as well as environmental concerns. Further, there is little control of composition uniformity.

Accordingly, deposition of metal-oxo material systems using a dry deposition processes is of increasing interest in the field of EUV and DUV lithography process flows. Dry deposition processes may include operations such as chemical vapor deposition (CVD) or atomic layer deposition (ALD) processes. In a CVD process, one or more metal precursors, oxidants, and the like are flown into a chamber and react in order to deposit the metal-oxo structure on the substrate. In an ALD process pulses of metal precursors and oxidants are provided to the chamber with inert gas purges between each pulse.

As can be appreciated, the use of dry deposition processes enables greater control of the composition uniformity. Additionally, controlled non-uniformity is also enabled by dry deposition processes. For example, the composition of the metal-oxo resist may be non-uniform through a thickness of the metal-oxo resist. Such embodiments allow for resist layers that are tunable for a given purpose. For example, the portion of the metal-oxo resist closest to the substrate (i.e., the bottom of the metal-oxo resist) may be tuned for improved adhesion properties, and the remainder of the metal-oxo resist may be tuned to have a high sensitivity. This allows for improved critical dimension (CD) control, as well as improved LER, among other photoresist properties.

In addition to embodiments that use a single metal precursor, embodiments disclosed herein may also use multiple, different, metal precursors. The use of different metal elements in the precursors allows for further tuning the compositional structure of the metal-oxo material system. For example, the volume percentage of one or both of the metal elements in the metal-oxo material system may be modified through the thickness of the metal-oxo material system. The dual metal metal-oxo system may also provide improvements in certain photoresist properties that are not possible when a single metal metal-oxo system is used.

In some embodiments disclosed herein, the dry deposition process includes the flow of one or more metal containing precursors. The metal precursors may have the general formula of $MR_xL_{n-x}$. In some embodiments, the ligands L may be homoleptic (i.e., all of the ligands are the same). Additionally, the reactive groups R may be functionalized to enhance performance of the metal-oxo system. In other embodiments, an oxidizing source gas may also be flown into the chamber. The oxidizing source gas may be used to increase the concentration of oxygen in the metal-oxo structure.

Referring now to FIG. 1, a flow diagram of a process 150 for forming a metal-oxo photoresist is shown, in accordance with an embodiment. In an embodiment, the process 150 may begin with operation 151 which includes flowing a first metal precursor into a chamber. The chamber may be a vacuum chamber suitable for CVD or ALD processing. For example, the chamber may include one or more inlets for introducing precursor gasses and/or inert purge gasses into the chamber.

In an embodiment, the first metal precursor may have a general formula of $M'R_xL_{n-x}$, where M' is a metal, R is a reactive group, and L is a ligand. The value of x may be up to 6, and the value of n may be at least 2 and up to 6. The metal M may be any suitable metal that is advantageous for EUV lithography patterning. For example, the metal M' may comprise Sn, Hf, Zr, Co, Cr, Mn, Fe, Cu, Ni, Mo, W, Ta, Os, Re, Pd, Pt, Ti, V, In, Sb, Te, Bi, Al, As, Ge, Se, Cd, Ag, Pb, Au, Er, Yb, Pr, La, Na, or Mg. In an embodiment, the reactive group R may comprise one or more of an alkyl (linear or branched), an alkenyl (linear, branched, or cyclic) with an alkane, an internal or terminal alkene, an alkynyl (linear, branched, or cyclic) with an internal or terminal alkyne, an aryl, a carbene, or an R group that comprises a silicon, a germanium, or a tin donor atom. In an embodiment, the ligand L may be a water reactive ligand such as one or more of an amine (e.g., $NR_2$ where R is a methyl or ethyl group), an alkoxide, a halide (e.g., Cl, Br, I), NCO, NCS, a carboxylic acid, an ester, or an acrylate.

In an embodiment, the process 150 may continue with operation 152, which comprises flowing a second metal precursor into the chamber. The second metal precursor may be different than the first metal precursor. More generally, the metal atom of the first metal precursor may be different than the metal atom of the second metal precursor. As such, a metal-oxo photoresist with more than one metal atom constituent can be provided.

In an embodiment, the second metal precursor may also have the general formula $M''R_xL_{n-x}$, where M'' is a metal, R is a reactive group, and L is a ligand. The value of x may be up to 6, and the value of n may be at least 2 and up to 6. The metal M'' may be a different metal than the metal M'. Additionally, the reactive group R and the ligand L may be different between the first metal precursor and the second metal precursor. However, the options for the second metal M″ may be similar to the options for the first metal M′. Further, the reactive group R and the ligand L may be similar to any of those described above with respect to the first metal precursor.

In an embodiment, the process 150 may then continue with operation 153, which comprises depositing a metal oxo film on a substrate in the chamber. The substrate may be a wafer (e.g., a silicon wafer), or any other substrate typical of semiconductor manufacturing processes. In an embodiment, the metal oxo film may be deposited as a result of the reaction between the first metal precursor and the second metal precursor. For example, the metal oxo film may contain metal elements of the first metal precursor and metal elements of the second metal precursor. That is, the metal oxo film may be an alloy of the first metal and the second metal. In some embodiments, the different metal elements may be directly bonded to each other. Though, carbon and oxygen atoms may also be incorporated into the metal oxo film.

In an embodiment, the deposition process 150 used to form the metal-oxo photoresist is a dry deposition process. In one embodiment, the dry deposition process may be considered a CVD process. That is, the two the metal precursors may be flown into the chamber at the same time. A CVD process may also include pulsing the metal precursors into the chamber in an alternating sequence. In other embodiments, the dry deposition process may be considered an ALD process. That is, the two different metal precursors may be flown into the chamber with sequential pulses that are separated from each other by a pulse of an inert gas.

The dry deposition process also provides additional knobs that can be controlled in order to modify the composition of the metal oxo photoresist through a thickness of the metal oxo photoresist. For example, a concentration of the first metal adjacent to the surface of the substrate may be higher than a concentration of the first metal spaced away from the surface of the substrate. This can be accomplished by providing a first flowrate of the first metal precursor at the beginning of deposition that is higher than a second flowrate of the first metal precursor after a given duration of the deposition process. In some embodiments, the second flowrate may be zero.

As noted above, some embodiments may include an alloyed metal-oxo film, where the first metal is chemically bonded to the second metal. However, in other embodiments, the metal-oxo film may have only the first metal at some thicknesses and the second metal at other thicknesses. The different metal layers may be alternated. Alternatively, the first metal may be present in a first layer, and the second metal may be present in the remainder of the metal-oxo film as a second layer. For example, the first layer may be up to several nanometers thick, and the second layer may be tens of nanometers thick. The first layer and the second layer may also have thicknesses that are substantially equal to each other.

Figure 2:
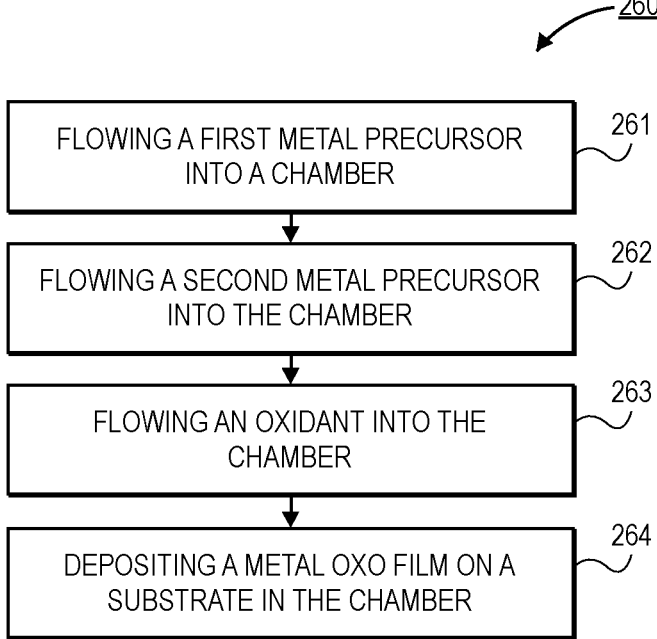
FIG. 2 is a process flow diagram of a process for depositing a metal-oxo photoresist onto a substrate with a dry deposition process that includes two different metal precursors and an oxidant, in accordance with an embodiment.

Referring now to FIG. 2, a flow diagram of a process 260 for forming a metal-oxo photoresist layer is shown, in accordance with an additional embodiment. In an embodiment, the process 260 may be similar to the process 150 described in greater detail above, with the addition of flowing an oxidant into the chamber during the process 260. That is, operation 261 may be substantially similar to operation 151, and operation 262 may be substantially similar to operation 152. That is, a first metal precursor including a general formula of $M'R_xL_{n-x}$ and a second metal precursor including a general formula of $M''R_xL_{n-x}$ may be included in the deposition process.

However, the process 260 may further comprise flowing an oxidant into the chamber at operation 263. The oxidant may include any suitable oxidizing source, such as, but not limited to, water, ethyleneglycol, alcohols (e.g., methanol, ethanol, etc.), peroxides (e.g., $H_2O_2$), $O_2$, $N_2O$, $CO_2$ CO, and acids (e.g., formic acid, acetic acid, etc.). The oxidant may be flown into the chamber at the same time one or both of the first metal precursor and the second metal precursor are flown into the chamber. Alternatively, the oxidant may be flown into the chamber by itself, without the first metal precursor and the second metal precursor being co-flowed. In yet another embodiment, the oxidant may be co-flown into the chamber with either the first metal precursor or the second metal precursor.

The dry deposition process may continue with operation 264 which comprises depositing a metal-oxo film on a substrate in the chamber. The metal-oxo film may be the result of the reaction between two or more of the first metal precursor, the second metal precursor, and the oxidant. The presence of the oxidant may result in an oxygen percentage in the metal-oxo film that is greater than the oxygen percentage provided by the process 150 described above. Further, due to the dry deposition processing (e.g., CVD type, or ALD type), the composition through the thickness of the metal-oxo film may be modulated in a similar fashion to what is described in greater detail above with respect to process 150.

Figure 3:
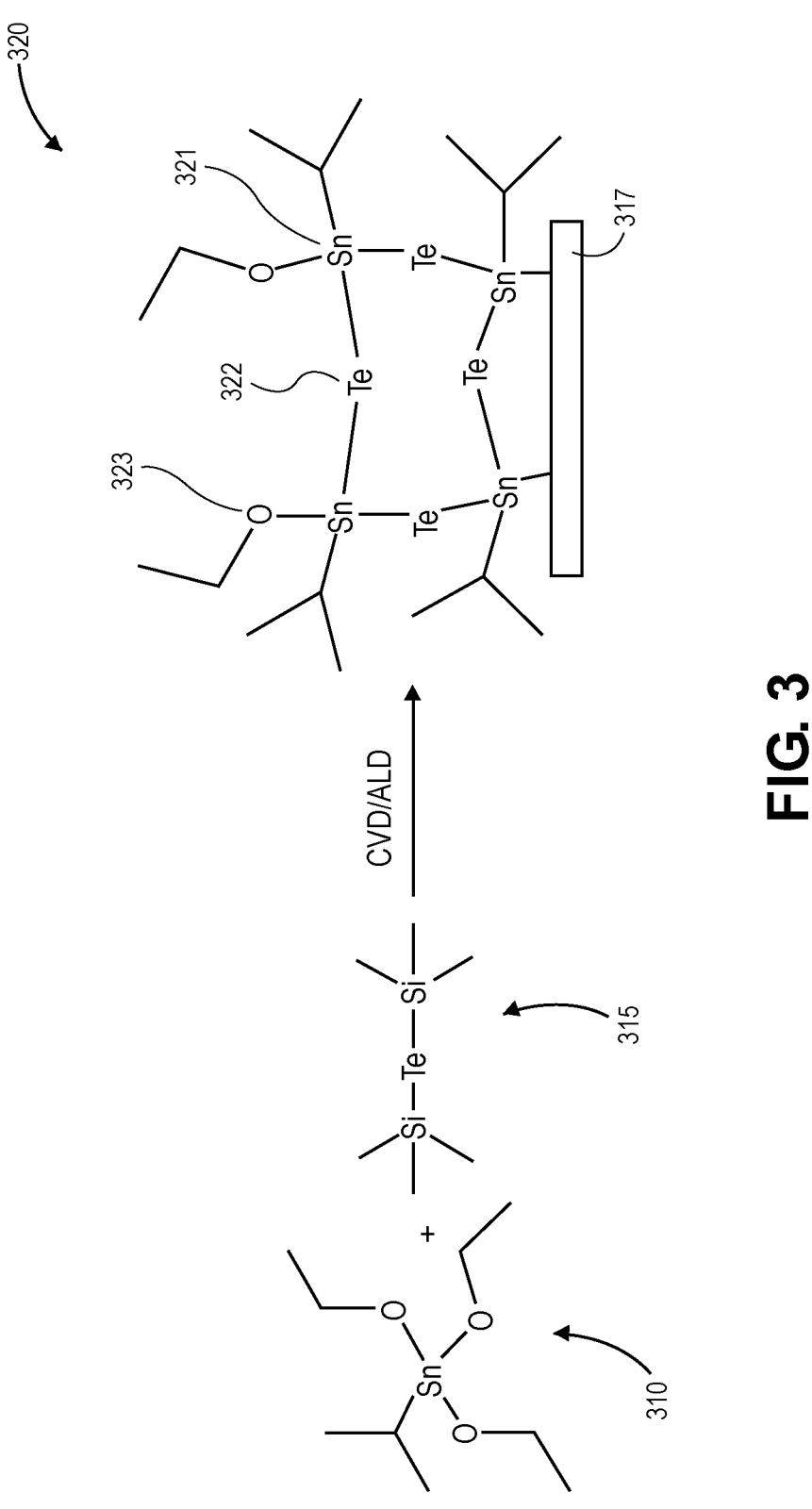
FIG. 3 is a chemical reaction that uses a first metal precursor and a second metal precursor in order to form a metal-oxo photoresist with a dual metal structure, in accordance with an embodiment.

Referring now to FIG. 3, a schematic of a chemical reaction that may be used to form the metal-oxo film 320 is shown as a particular embodiment. In an embodiment, the chemical reaction involves a first metal precursor 310 and a second metal precursor 315 reacting through either a CVD mechanism or an ALD mechanism in order to form an alloyed metal-oxo film 320 on a substrate 317.

In an embodiment, the first metal precursor 310 may comprise a Sn metal center that is chemically bonded to oxygen and carbon. The second metal precursor 315 may comprise tellurium, silicon, and carbon. In some embodiments, the first metal precursor 310 directly reacts with the second metal precursor 315 to form the metal-oxo film 320. In other embodiments, an oxidant (not shown) may also aid in the reaction between the first metal precursor 310 and the second metal precursor 315. While two specific examples of metal precursors are provided, it is to be appreciated that any metal precursors with the general formula $MR_xL_{n-x}$ may be used, as described in greater detail above.

In an embodiment, the metal-oxo film 320 may be considered an alloy of the first metal (e.g., Sn) and the second metal (e.g., Te). As shown in the diagram, tin 321 may be directly bonded to tellurium 322. Carbon and oxygen 323 may also be incorporated into the metal-oxo film 320. For example, including an oxidant source may increase the concentration of oxygen in the metal-oxo film 320.

In the illustrated embodiment, the tellurium 322 and the tin 321 are distributed through an entire thickness of the metal-oxo film 320. Such an embodiment may be provided when both the first metal precursor 310 and the second metal precursor 315 are co-flown into the chamber at the same time. If, in contrast, alternating pulses of the first metal precursor 310 and the second metal precursor 315 are used, then there may be distinct layers with alternating layers including different metal atoms. In some embodiments, one of the metal atoms may provide improved adhesion to the substrate 317, and the other metal atom may provide improved sensitivity. The atom with better adhesion may be provided in bottom regions of the metal-oxo film 320, and the atom with better sensitivity may be provided over the bottom region. Despite being referred to as having different layers, the entirety of the metal-oxo film 320 may still be referred to as being alloyed in some embodiments.

Figure 4A:
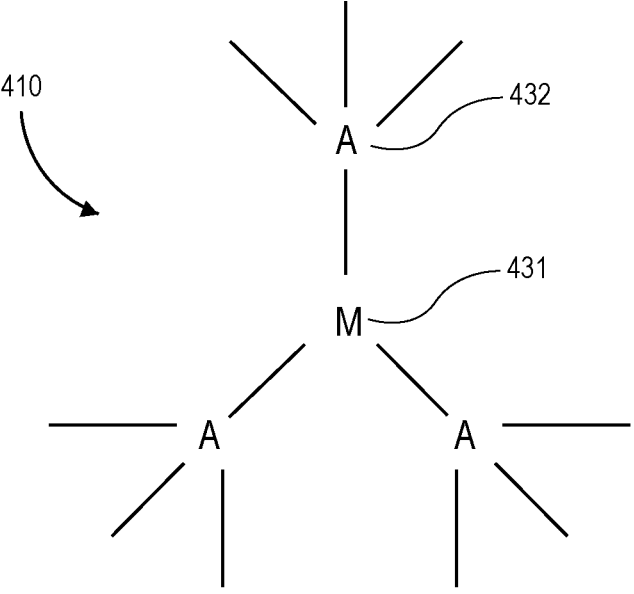
FIG. 4A is an illustration of a metal precursor with a homoleptic ligand structure, in accordance with an embodiment.

Referring now to FIG. 4A, a generic metal precursor 410 is shown, in accordance with an additional embodiment. The metal precursor 410 may be referred to as being a homoleptic metal precursor 410. That is, each of the ligands are substantially similar to each other. For example, in FIG. 4A, the ligands extending out from the metal 431 may each have the same center atom A 432 with carbon connections. The center atom A may be a silicon, a germanium, a carbon, or a nitrogen in some embodiments. In the illustrated embodiment, three ligands are shown extending out from the metal 431. Though, it is to be appreciated that any number of ligands may be used, depending on the metal chosen for the metal 431.

Figure 4B:
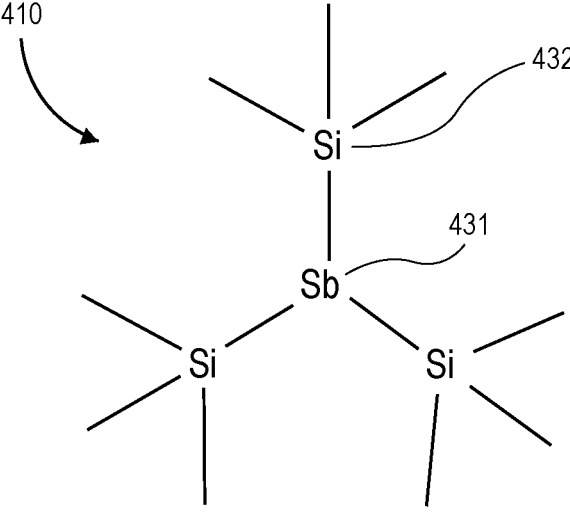
FIG. 4B is an illustration of an antimony based metal precursor with a homoleptic ligand structure, in accordance with an embodiment.

For example, in FIG. 4B a metal precursor 410 that includes an antimony metal center 431 is shown, in accordance with an embodiment. The antimony metal center 431 may have three ligands. Each of the ligands may have a silicon center atom 432 with a set of three carbons attached to each of the silicon center atoms 432. It is to be appreciated that the example shown in FIG. 4B is just one example of such a homoleptic metal precursor 410, and other options may also be used. In an embodiment, a homoleptic precursor may be substituted for any of the metal precursors described in greater detail above. For example, a homoleptic metal precursor 410 may be used with another metal precursor and with or without the presence of an oxidant.

Figure 5:
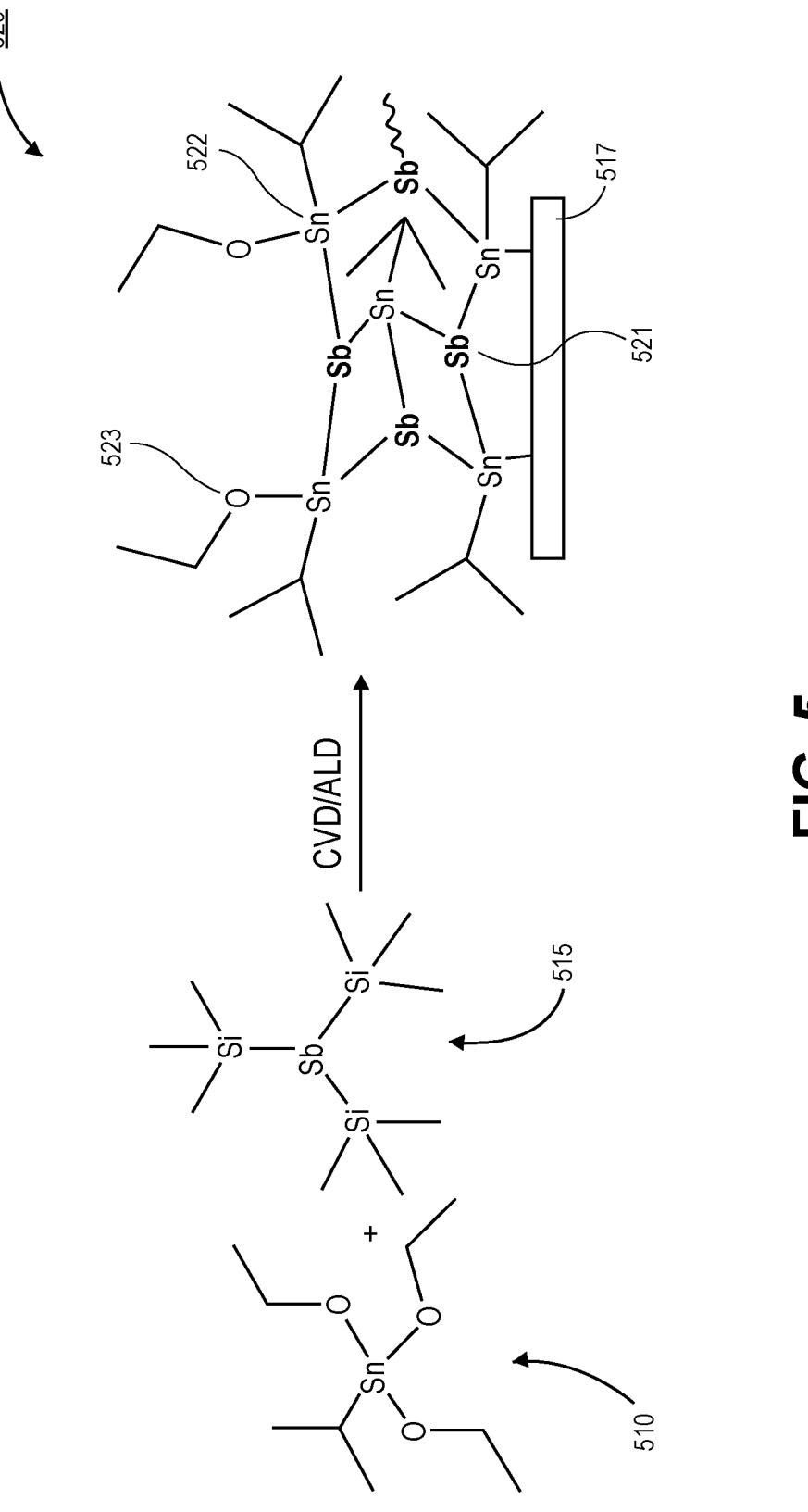
FIG. 5 is a chemical reaction with a first metal precursor and a second metal precursor with a homoleptic ligand structure to form a metal-oxo photoresist with a dual metal structure, in accordance with an embodiment.

Referring now to FIG. 5, a schematic of a chemical reaction that may be used to form the metal-oxo film 520 is shown as a particular embodiment. In an embodiment, the chemical reaction involves a first metal precursor 510 and a second metal precursor 515 reacting through either a CVD mechanism or an ALD mechanism in order to form an alloyed metal-oxo film 520 on a substrate 517.

In an embodiment, the first metal precursor 510 may comprise a Sn metal center that is chemically bonded to oxygen and carbon. The second metal precursor 515 may comprise antimony, silicon, and carbon. More particularly, the second metal precursor 515 may be a homoleptic metal precursor similar to those shown in FIGS. 4A and 4B above. In some embodiments, the first metal precursor 510 directly reacts with the second metal precursor 515 to form the metal-oxo film 520. In other embodiments, an oxidant (not shown) may also aid in the reaction between the first metal precursor 510 and the second metal precursor 515. While two specific examples of metal precursors are provided, it is to be appreciated that any metal precursors with the general formula $MR_xL_{n-x}$ may be used in conjunction with a homoleptic metal precursor. Additionally, a pair of two, different, homoleptic metal precursors may be used to form an alloyed metal-oxo film 520.

In an embodiment, the metal-oxo film 520 may be considered an alloy of the first metal (e.g., Sn) and the second metal (e.g., Sb). As shown in the diagram, tin 522 may be directly bonded to antimony 521. Carbon and oxygen 523 may also be incorporated into the metal-oxo film 520. For example, including an oxidant source may increase the concentration of oxygen in the metal-oxo film 520.

In the illustrated embodiment, the antimony 521 and the tin 522 are distributed through an entire thickness of the metal-oxo film 520. Such an embodiment may be provided when both the first metal precursor 510 and the second metal precursor 515 are co-flown into the chamber at the same time. If, in contrast, alternating pulses of the first metal precursor 510 and the second metal precursor 515 are used, then there may be distinct layers with alternating layers including different metal atoms. In some embodiments, one of the metal atoms may provide improved adhesion to the substrate 517, and the other metal atom may provide improved sensitivity. The atom with better adhesion may be provided in bottom regions of the metal-oxo film 520, and the atom with better sensitivity may be provided over the bottom region. Despite being referred to as having different layers, the entirety of the metal-oxo film 520 may still be referred to as being alloyed in some embodiments.

Referring now to FIG. 6, a flow diagram of a process 670 for forming a metal-oxo film is shown, in accordance with an additional embodiment. In an embodiment, the process 670 in FIG. 6 may include a single metal precursor. However, embodiments may also include alloyed metal-oxo films. In the particular embodiment shown in FIG. 6, process 670 begins with operation 671, which comprises flowing a first metal precursor with functionalized R groups into a chamber. In an embodiment, the metal precursor may have the generic formula $MR_xL_{n-x}$ described in greater detail above, and further include functionalized R groups. Examples of functionalized R groups are provided below with respect to FIGS. 7A-7D, and an example of a full metal precursor is shown in FIG. 8.

In an embodiment, the process 670 may continue with operation 672, which comprises flowing an oxidant into the chamber. The oxidant and the metal precursor may react to form a metal-oxo film. For example, operation 673 may include depositing the metal-oxo film on a substrate in the chamber. In an embodiment, the deposition may be the result of a CVD process or an ALD process. The deposition process may be similar to embodiments described in greater detail above. In one embodiment, a flow rate of the metal precursor may be modulated in order to provide a gradient of the metal through a thickness of the metal-oxo film. Additionally, secondary metal precursors may also be flown into the chamber to provide an alloyed metal-oxo film in some embodiments.

Referring now to FIG. 7A, an example of a functionalized R group is shown, in accordance with an embodiment. In FIG. 7A, the R is a hydrocarbon that is functionalized with X features to enhance lithography performance. More particularly, FIG. 7A illustrates a functionalized n-butyl R group. The X in the functionalization may be one of several different elements or compounds. For example, the X may represent H, OR (where R is a methyl or an ethyl), CN, NCO, NCS, F, Cl, Br, I, ester, acid, oxalate, or acrylate.

Referring now to FIG. 7B, an example of a functionalized R group on an alkene is shown. The X functionalizations in FIG. 7B may be substantially similar to those described in greater detail above with respect to FIG. 7A. Similarly, an alkyne that is functionalized by X functionalizations is shown in FIG. 7C. An aryl with X functionalizations is shown in FIG. 7D. In each of the embodiments shown in FIGS. 7A-7D, a single X functionalization is shown. However, in some embodiments, two or more different functionalizations may be provided on a single hydrocarbon (e.g., a linear hydrocarbon, a branched hydrocarbon, or a cyclic hydrocarbon).

Referring now to FIG. 8, a chemical formula of an exemplary metal precursor with a functionalized R group is shown, in accordance with an embodiment. In an embodiment, the metal precursor comprises a tin metal center. While tin is shown as one example, it is to be appreciated that any of the atoms described as an M' or M'' center above may be used in the metal precursor shown in FIG. 8. The metal precursor further comprises a linear hydrocarbon R group extending out from the metal center. In an embodiment, the linear hydrocarbon R group is functionalized by a halide (e.g., I). In an embodiment, the metal center may further comprise amine ligands. Though, it is to be appreciated that any of the ligands L described in greater detail above may also be used for the metal precursor in FIG. 8.

The metal precursor in FIG. 8 may be particularly beneficial for the process 670 described in greater detail above. However, it is to be appreciated that the metal precursor in FIG. 8 may also be used in conjunction with the process 150 described in greater detail above or the process 260 described in greater detail above.

Figure 9:
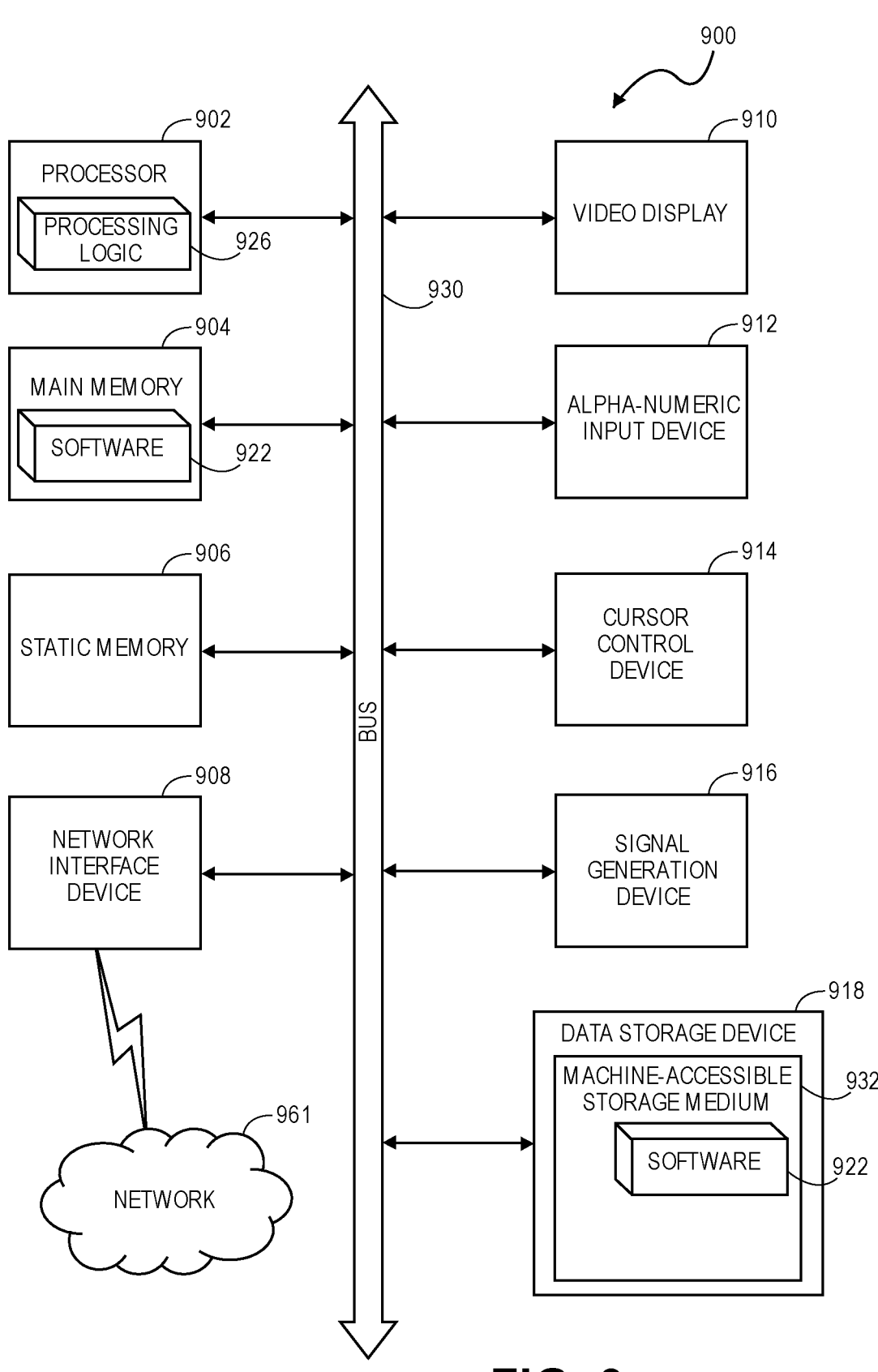
FIG. 9 illustrates a block diagram of an exemplary computer system, in accordance with an embodiment of the present disclosure.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), MRAM, etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computerreadable storage medium) 932 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 961 via the network interface device 908.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of providing a first metal precursor into a chamber, and providing a second metal precursor into a chamber. The first and second metal precursor may react with each other and/or react with an oxidant to form a metal-oxo photoresist on a substrate in the chamber. The first and/or second metal precursor may have homoleptic ligands. The metal-oxo photoresist may be described as being an alloyed metal-oxo photoresist in some embodiments. In other embodiments, the metal-oxo photoresist may be formed with a single metal precursor that includes one or more functionalized R groups.

Thus, methods for forming a metal-oxo photoresist with improved lithography performance are described.

What is claimed is:

1. A method of forming a metal-oxo photoresist, comprising:
   flowing a first precursor into a chamber, wherein the first precursor comprises a first metal;
   flowing a second precursor into the chamber, wherein the second precursor comprises a second metal that is different than the first metal, and wherein the second precursor comprises a homoleptic structure; and
   depositing the metal-oxo photoresist on a substrate in the chamber using a dry deposition process using the first precursor and the second precursor.

2. The method of claim 1, wherein the dry deposition process is a chemical vapor deposition (CVD) process.

3. The method of claim 2, wherein the first precursor and the second precursor are flown into the chamber at the same time.

4. The method of claim 2, wherein the first precursor and the second precursor are sequentially flown into the chamber.

5. The method of claim 1, wherein the dry deposition process is an atomic layer deposition (ALD) process.

6. The method of claim 1, wherein the first metal comprises tin and the second metal comprises tellurium.

7. The method of claim 1, further comprising:

flowing an oxidant into the chamber with the first precursor and the second precursor.

8. The method of claim 1, wherein the metal-oxo photoresist comprises a bond between the first metal and the second metal.

9. The method of claim 1, wherein a composition of the first metal in the metal-oxo photoresist is non-uniform through a thickness of the metal-oxo photoresist.

10. The method of claim 1, wherein ligands of the homoleptic structure comprise silicon, germanium, carbon, or nitrogen.

11. A method of forming a metal-oxo photoresist, comprising:

flowing a precursor gas into a chamber, wherein the precursor gas comprises a general formula of $MR_xL_{n-x}$, wherein M is a metal, R is a reactive group, and L is a ligand, and wherein x is equal to 1-4, and n is equal to 1-5;

flowing an oxidant into the chamber; and depositing the metal-oxo photoresist onto a substrate in the chamber with a dry deposition process.

12. The method of claim 11, wherein the reactive group R is a hydrocarbon that is functionalized.

13. The method of claim 12, wherein the hydrocarbon is functionalized by an H, an OR group (where R is a methyl or ethyl), a CN, a NCO, a NCS, a F, a Cl, a Br, an I, an ester, an acid, an oxalate, or an acrylate.

14. The method of claim 12, wherein the hydrocarbon is an alkane, an alkene, an alkyne, or an aryl.

15. The method of claim 11, L is an amine, an alkoxide, a halide, an NCO, an NCS, a carboxylic acid, an ester, or an acrylate.

16. The method of claim 11, wherein the metal M comprises one or more of Sn, Hf, Zr, Co, Cr, Mn, Fe, Cu, Ni, Mo, W, Ta, Os, Re, Pd, Pt, Ti, V, In, Sb, Te, Bi, Al, As, Ge, Se, Cd, Ag, Pb, Au, Er, Yb, Pr, La, Na, or Mg.

* * * * *